US009133339B2

(12) United States Patent
Hsieh

(10) Patent No.: US 9,133,339 B2
(45) Date of Patent: Sep. 15, 2015

(54) RESIN COMPOSITION, PREPREG, LAMINATE AND PRINTED CIRCUIT BOARD USING THE SAME

(71) Applicant: ELITE MATERIALS CO., LTD., Guanyin Township (TW)

(72) Inventor: Chen-Yu Hsieh, Guanyin Township (TW)

(73) Assignee: ELITE MATERIALS CO., LTD., Guanyin Township (TW)

( * ) Notice: Subject to any disclaimer, the term of this patent is extended or adjusted under 35 U.S.C. 154(b) by 10 days.

(21) Appl. No.: 14/107,585

(22) Filed: Dec. 16, 2013

(65) Prior Publication Data

US 2014/0288240 A1    Sep. 25, 2014

(30) Foreign Application Priority Data

Mar. 25, 2013    (TW) .............................. 102110562 A

(51) Int. Cl.
*C08L 79/00*    (2006.01)
*H05K 1/03*    (2006.01)

(52) U.S. Cl.
CPC .............. *C08L 79/00* (2013.01); *H05K 1/0353* (2013.01); *H05K 2201/0209* (2013.01)

(58) Field of Classification Search
CPC .................................................. C08L 2666/20
USPC ....................................................... 525/133
See application file for complete search history.

(56) References Cited

U.S. PATENT DOCUMENTS

| 4,670,485 | A | * | 6/1987 | Hesse et al. .................... 523/436 |
| 4,894,414 | A | | 1/1990 | Yang et al. |
| 6,063,839 | A | * | 5/2000 | Oosedo et al. ................. 523/206 |
| 6,667,107 | B2 | | 12/2003 | Tsuchikawa et al. |
| 7,090,924 | B2 | | 8/2006 | Sharma et al. |
| 7,425,371 | B2 | | 9/2008 | Sharma et al. |
| 2003/0198823 | A1 | | 10/2003 | Sharma et al. |
| 2005/0059783 | A1 | * | 3/2005 | Furrer et al. ................. 525/333.7 |
| 2007/0178300 | A1 | * | 8/2007 | Amla et al. .................... 428/332 |
| 2009/0191387 | A1 | * | 7/2009 | Paul et al. .................. 428/195.1 |
| 2010/0210745 | A1 | * | 8/2010 | McDaniel et al. ............... 521/55 |
| 2010/0233495 | A1 | * | 9/2010 | Mizuno et al. ................. 428/462 |
| 2011/0054087 | A1 | * | 3/2011 | Chopdekar et al. ........... 524/110 |

FOREIGN PATENT DOCUMENTS

CN           101824157 A   *   9/2010

OTHER PUBLICATIONS

Machine Translation of CN 101824157 A obtained from Global Patent Search Network.*
Office Action issued Aug. 27, 2014 in corresponding Taiwanese application, English translation provided, 9 pages total.

* cited by examiner

*Primary Examiner* — Mike M Dollinger
(74) *Attorney, Agent, or Firm* — Hamre, Schumann, Mueller & Larson, P.C.

(57) ABSTRACT

A resin composition contains: (A) 100 parts by weight of the cyanate ester resin; (B) 5 to 80 parts by weight of the styrene-maleic anhydride copolymer; (C) 15 to 80 parts by weight of the styrene-butadiene-divinyl benzene (SBDVB) terpolymer; and (D) 5 to 60 parts by weight of the acrylate compound, where the contents of the styrene-maleic anhydride copolymer, the styrene butadiene divinyl benzene terpolymer, and the acrylate compound are based on 100 parts by weight of the cyanate ester resin. By providing such formulation, the resin composition of the present invention exhibits low dielectric constant, low dielectric dissipation, high thermal stability and high flame resistance, and is useful in manufacturing a prepreg or a resin film, and is further useful in manufacturing a laminate and a printed circuit board.

11 Claims, No Drawings

RESIN COMPOSITION, PREPREG, LAMINATE AND PRINTED CIRCUIT BOARD USING THE SAME

BACKGROUND OF THE INVENTION

1. Field of the Invention

The present invention relates to a resin composition, and in particular, to a resin composition useful in manufacturing a prepreg, a laminate and a printed circuit board, and the prepreg, the laminate and the printed circuit board formed by using the same.

2. Description of the Related Art

Due to low dielectric constant, low dielectric dissipation and good thermal stability, it is common practice to employ a resin composition with epoxy resin as the main component to manufacture a laminate of a printed circuit board. However, as electronic products become smaller through miniaturization and demands for functionality get expand, printed circuit boards need to accommodate a growing density of components and more demanding requirements for signal transmission and signal frequency. Consequently, more stringent standards need to be met in terms of dielectric property and thermal stability of a laminate used in a printed circuit board. For example, for a high-speed high-frequency circuit, a substrate is required to have good insulating property, for example, low dielectric dissipation and low dielectric constant. Generally speaking, the lower the dielectric dissipation (dissipation factor, Df) and the dielectric constant (dielectric constant, Dk) are, the better the property is. If a difference in Dk is as high as 0.1, it indicates that the difference is significant; similarly, if a difference in Df is as high as 0.001, it indicates that the difference is significant. Environmental concerns have given rise to a preference for halogen-free flame retardant. Therefore, there has been a demand for a substrate material having good heat resistance and dielectric property and satisfying increasingly stringent environmental requirements.

The dielectric property and thermal property of a substrate material are relevant to components of a resin composition for forming the substrate material and contents of the components. For example, U.S. Pat. No. 6,667,107 discloses a resin composition for forming a prepreg and a laminate, in which a copolymer of styrene and maleic anhydride and a thermosetting resin are cured to provide preferable low dielectric property, preferable heat resistance, preferable moisture resistance and preferable adhesion to a copper foil. U.S. Pat. No. 7,090,924 discloses a thermosetting resin material specifically useful in manufacturing a laminate with low dielectric constant and low dielectric dissipation, where the thermosetting resin material contains an elastomer selected from a styrene-butadiene-divinyl benzene (SBDVB) terpolymer, a maleinized polybutadiene styrene copolymer, and mixtures thereof, a polyester and a brominated flame retardant, in which the content of the polyester is 1 wt % to 15 wt %, based on the weight of the composition solids. U.S. Pat. No. 7,425,371 also discloses a thermosetting resin material specifically useful in manufacturing a laminate with low dielectric constant and low dielectric dissipation. One difference between U.S. Pat. No. 7,425,371 and U.S. Pat. No. 7,090,924 lies in that the content of the polyester used is 2 wt % to 8 wt %, and it is defined that the polyester does not contain styrene.

Some resin compositions are formulated merely to provide the formed material with low dielectric property without particularly targeting heat resistance; or merely to provide the formed material with good heat resistance, without particularly targeting the dielectric property. Therefore, there is still in need for a novel resin formulation that can provide a composite material with good heat resistance and dielectric property and satisfy increasingly stringent environmental requirements.

SUMMARY OF THE INVENTION

In view of the above, an objective of the present invention is to provide a resin composition useful in manufacturing a prepreg, a laminate and a printed circuit board. The resin composition contains: (A) 100 parts by weight of the cyanate ester resin; (B) 5 to 80 parts by weight of the styrene-maleic anhydride copolymer; (C) 15 to 80 parts by weight of the SBDVB terpolymer; and (D) 5 to 60 parts by weight of the acrylate compound, in which the contents of the styrene-maleic anhydride copolymer, the SBDVB terpolymer and the acrylate compound are based on 100 parts by weight of the cyanate ester resin. The resin composition of the present invention is specifically useful in manufacturing a prepreg, a laminate and a printed circuit board with low dielectric constant, low dielectric dissipation, high thermal stability and high flame resistance.

The component (A) cyanate ester resin used in the resin composition of the present invention is used to provide the cured resin or the formed laminate with the desired basic dielectric property and heat resistance. A cyanate ester resin useful in the present invention is not particularly limited, may be a conventionally used cyanate ester resin, for example, a compound having a structure (Ar—O—C≡N), in which Ar may be substituted or unsubstituted benzene, biphenyl, naphthalene, phenol novolac, bisphenol A, bisphenol A novolac, bisphenol F, bisphenol F novolac or phenolphthalein. In addition, Ar may be further bonded with substituted or unsubstituted dicyclopentadienyl (DCPD).

According to an embodiment of the present invention, the cyanate ester resin preferably contains a structure selected from the group consisting of:

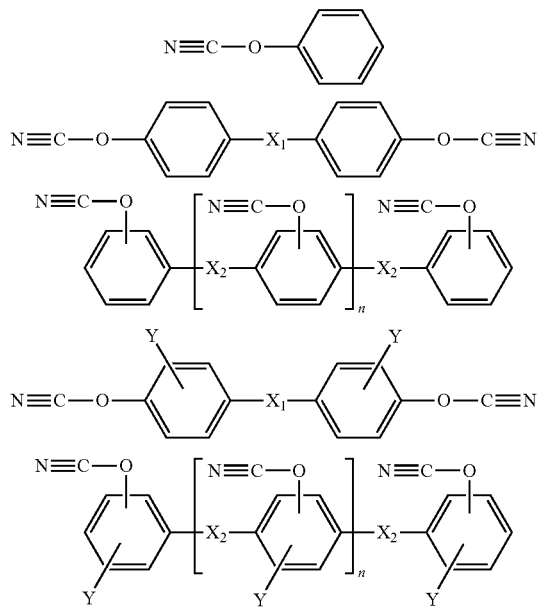

-continued

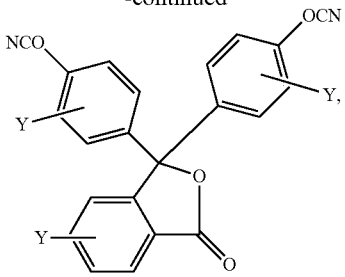

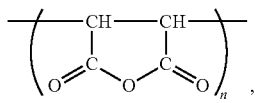

where $X_1$ and $X_2$ are each independently at least one R, Ar', $SO_2$ or O; R is selected from —$C(CH_3)_2$—, —$CH(CH_3)$—, —$CH_2$— and a group containing DCPD; Ar' is selected from benzene, biphenyl, naphthalene, phenol novolac, bisphenol A, cyclofluorene, hydrogenated bisphenol A, bisphenol A novolac, bisphenol F and bisphenol F novolac functional groups; n is an integer greater than or equal to 1; and Y is an aliphatic functional group or an aromatic functional group.

The term "aliphatic functional group" refers to C1-C30 alkanes, alkenes, alkynes, cycloalkanes, cycloolefins and derivatives thereof. The term "aromatic functional group" refers to C1-C14 compound having a benzene ring, for example, benzene, naphthalene, anthracene and derivatives thereof.

Examples of the cyanate ester resin include, but not limited to, cyanate ester resin with tradenames Primaset PT-15, PT-30S, PT-60S, CT-90, BADCY, BA-100-10T, BA-200, BA-230S, BTP-2500, BTP-6020S, DT-4000, DT-7000, Methylcy, and ME-240S (manufactured by Lonza). One or a combination of the types of cyanate ester resin may be added in the resin composition of the present invention.

According to an embodiment of the present invention, the cyanate ester resin is preferably butadiene pre-polymerized cyanate ester resin formed through pre-polymerization of butadiene and cyanate, wherein the higher the content of butadiene in the butadiene pre-polymerized cyanate ester resin is, the better the dielectric dissipation property is.

The component (B) styrene-maleic anhydride copolymer used in the resin composition of the present invention serves as a co-crosslinking agent of the resin composition, According to the present invention, the component (B) copolymer may contain a monomer unit represented by Formula (a) below:

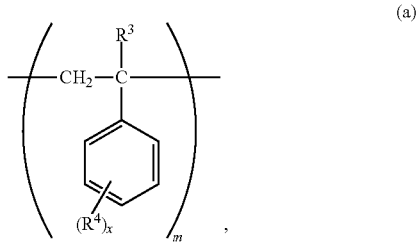

where $R^3$ is a hydrogen atom, a halogen atom or a hydrocarbyl group having 1 to 5 carbon atoms, each $R^4$ individually represents a halogen atom, an aliphatic hydrocarbyl group having 1 to 5 carbon atoms, or an aromatic hydrocarbyl group, x is an integer of 0 to 3, and preferably 0, and m is a natural number; and a monomer unit represented by Formula (b) below:

(b)

where n is a natural number.

According to an embodiment of the present invention, a ratio of styrene (S) to maleic anhydride (MA) in the component (B) styrene-maleic anhydride copolymer may be 1/1, 2/1, 3/1, 4/1, 6/1 or 8/1. The component (B) styrene-maleic anhydride copolymer includes, for example, but not limited to, styrene-maleic anhydride copolymers with tradenames SMA-1000, SMA-2000, SMA-3000, EF-30, EF-40, EF-60 and EF-80 (available from Cray Valley). In addition, the styrene-maleic anhydride copolymer may also be an esterified styrene-maleic anhydride copolymer, and includes, for example, esterified styrene-maleic anhydride copolymers with tradenames SMA1440, SMA17352, SMA2625, SMA3840 and SMA31890 (available from Cray Valley). One or a combination of the types of styrene-maleic anhydride copolymer may be added in the resin composition of the present invention.

In the resin composition of the present invention, based on 100 parts by weight of the cyanate ester resin, 5 to 80 parts by weight of the styrene-maleic anhydride copolymer is added, and preferably 10 to 60 parts by weight of the styrene-maleic anhydride copolymer is added.

The component (C) SBDVB terpolymer used in the resin composition of the present invention serves as a second co-crosslinking agent of the resin composition.

The SBDVB terpolymer contains multiple unsaturated bonds, so that the SBDVB terpolymer can crosslink with other resin compounds in curing. An example of the SBDVB terpolymer is a polybutadiene styrene divinylbenzene graft terpolymer (or styrene-butadiene divinyl benzene terpolymer) with a tradename Ricon® 257 (available from Sartomer).

According to an embodiment of the present invention, the content of the SBDVB terpolymer in the resin composition of the present invention is 15 to 80 parts by weight, and preferably 20 to 70 parts by weight, based on 100 parts by weight of the cyanate ester resin.

The component (D) acrylate compound used in the resin composition of the present invention serves as a third co-crosslinking agent. The acrylate compound used in the present invention generally refers to a monomer containing an acrylate unsaturated group and derivatives of the monomer, an oligomer containing an acrylate unsaturated group and derivatives of the oligomer, or a combination thereof.

The term "oligomer" herein has the generally meaning in the technical field of the present invention, for example, refers to a compound formed by a monomer. For example, oligomer containing an acrylate unsaturated group refers to a dimer, trimer, tetramer or pentamer of a monomer containing an acrylate unsaturated group.

The "derivatives of a monomer" herein has the generally meaning in the technical field of the present invention, for example, refers to a substituted monomer.

The "derivatives of an oligomer" herein has the generally meaning in the technical field of the present invention, for example, refers to a substituted oligomer.

An acrylate compound useful in the present invention includes, but not limited to, the following monomers: isobornyl (meth)acrylate, cyclohexyl (meth)acrylate, methyl acrylate, ethyl (meth)acrylate, propyl (meth)acrylate, n-butyl (meth)acrylate, 2-ethylhexyl (meth)acrylate, n-octyl (meth) acrylate, hexyl (meth)acrylate, pentyl (meth)acrylate, heptyl (meth)acrylate, isooctyl (meth)acrylate, nonyl (meth)acrylate, isobutyl (meth)acrylate, 2-butyl (meth)acrylate, decyl (meth)acrylate, isodecyl (meth)acrylate, isotridecyl (meth) acrylate, benzyl (meth)acrylate, dodecyl (meth)acrylate, tricyclodecane dimethanol diacrylate (for example, Sr833s, a product available from Sartomer) and polybutadiene diacrylate oligomer (for example, CN307, a product available from Sartomer).

According to an embodiment of the present invention, preferably, the acrylate compound of the present invention is a tricyclodecane dimethanol diacrylate monomer, a polybutadiene diacrylate oligomer, or a combination thereof.

In the resin composition of the present invention, based on 100 parts by weight of the cyanate ester resin, 5 to 60 parts by weight, and preferably 10 to 60 parts by weight of the acrylate is added.

The resin composition of the present invention may further contain a halogen-free flame retardant, and all halogen-free flame retardants known to persons of ordinary skill in the art can be used. The halogen-free flame retardant may be a nitrogen-containing flame retardant or a phosphorus-containing flame retardant. The halogen-free flame retardant may be, for example, but not limited to, bisphenol diphenyl phosphate, ammonium poly phosphate, hydroquinone bis-(diphenyl phosphate), bisphenol A bis-(diphenylphosphate), tri(2-carboxyethyl)phosphine (TCEP), tri(chloroisopropyl)phosphate, trimethyl phosphate (TMP), dimethyl methyl phosphonate (DMMP), resorcinol dixylenylphosphate (RDXP, such as PX-200), a phosphazene compound (phosphazene, for example, SPB-100, SPH-100 and SPE-100, products available from Otsuka Chemical Co., Ltd. or FP-110 and FP-300, products available from Fushimi Pharmaceutical Co., Ltd.), m-phenylene methylphosphonate (PMP), melamine polyphosphate (for example, Melapur 200, a product available from BASF Company), melamine cyanurate, aluminum diethylphosphinate (OP-935, available from Clariant) and tri-hydroxy ethyl isocyanurate). In addition, the halogen-free flame retardant may also be 9,10-dihydro-9-oxa-10-phosphaphenanthrene-10-oxide (DOPO), DOPO-containing phenol resin (for example, DOPO-HQ, DOPO-PN, DOPO-BPN), DOPO-containing epoxy resin, and DOPO-HQ-containing epoxy resin, in which DOPO-BPN may be a bisphenol novolac compound such as DOPO-BPAN, DOPO-BPFN, DOPO-BPSN. According to an embodiment of the present invention, a halogen-free flame retardant useful in the resin composition of the present invention is preferably selected from the group consisting of phosphazene, aluminum diethylphosphinate, melamine polyphosphate, and a combination thereof.

In the resin composition of the present invention, based on 100 parts by weight of the cyanate ester resin, 10 to 150 parts by weight of the halogen-free flame retardant may be added, and by adding the halogen-free flame retardant to a content in this range, the halogen-free resin composition can achieve the retardant effect.

The resin composition of the present invention may further contain at least one additive selected from the group consisting of an inorganic filler, a catalyst, a silane coupling agent, a toughening agent and a solvent.

According to the present invention, the inorganic filler is mainly used to increase the thermal conductivity of the resin composition and improve the properties such as thermal expansibility and mechanical strength, and the inorganic filler is preferably evenly distributed in the resin composition. An inorganic filler useful in the present invention is not particularly limited, may be any inorganic filler known to persons of ordinary skill in the art, and for example, includes, but not limited, (fused, non-fused, porous or hollow) silica, alumina, aluminum hydroxide, magnesium oxide, magnesium hydroxide, calcium carbonate, aluminum nitride, boron nitride, aluminum silicon carbide, silicon carbide, titanium oxide, zinc oxide, zirconium oxide, mica, boehmite (AlOOH), calcined talc, talc, silicon nitride and calcined kaolin. The inorganic filler may be in a spherical shape, a fibrous shape, a sheet-like shape, a granular shape or a needle-like shape, and may be optionally pre-treated by a silane coupling agent.

The inorganic filler may be a powder having a particle diameter of less than 100 μm, and preferably a powder having a particle diameter of 1 nm to 20 μm, and most preferably a nano-sized powder having a particle diameter of less than 1 μm; and an inorganic filler in a needle-like shape may be a powder having a diameter of less than 50 μm and a length of 1 to 200 μm, and preferably a powder having a diameter of less than 5 μm and a length of 1 to 200 μm.

In the resin composition of the present invention, based on 100 parts by weight of the cyanate ester resin, 10 to 200 parts by weight of the inorganic filler may be added, and preferably 70 to 160 parts by weight of the inorganic filler may be added.

In the resin composition of the present invention, one or more catalysts may be optionally added, to improve the curing rate of the resin. Any catalyst capable of improving the curing rate of the resin composition of the present invention may be used. A preferred catalyst includes a peroxide catalyst capable of generating a free radical, for example, but not limited to, dicumyl peroxide (DCP), test-butyl peroxybenzoate and di(tert-butylperoxyisopropyl)benzene (BIPB). According to an embodiment of the present invention, a catalyst useful in the resin composition of the present invention is preferably BIPB.

The resin composition of the present invention may contain 0.1 to 10 parts by weight of the catalyst, based on 100 parts by weight of the cyanate ester resin.

A silane coupling agent useful in the resin composition of the present invention is not particularly limited, may be any silane coupling agent known to persons of ordinary skill in the art, and includes, but not limited to, silane and siloxane, which may be classified into amino silane, amino siloxane, epoxy silane and epoxy siloxane according to the type of the functional group.

A toughening agent useful in the resin composition of the present invention is not particularly limited, and may be any toughening agent known to persons of ordinary skill in the art. A toughening agent useful in the resin composition of the present invention includes, but not limited to, rubber resin, carboxyl-terminated butadiene acrylonitrile rubber (CTBN), and core-shell rubber.

A solvent useful in the resin composition of the present invention is not particularly limited, may be any solvent known to persons of ordinary skill in the art, and includes, but not limited to, methanol, ethanol, ethylene glycol monomethyl ether, acetone, butanone (methyl ethyl ketone), methyl isobutyl ketone, cyclohexanone, toluene, xylene, methoxy ethyl acetate, ethoxy ethyl acetate, propoxy ethyl acetate, ethyl acetate, dimethyl formamide, propylene glycol methyl ether, and a mixture thereof. According to an embodiment of the present invention, toluene is preferably used as a solvent.

In addition to the additives described above, in the resin composition of the present invention, polyphenylene oxide may be additionally added, and preferably styrene modified polyphenylene oxide may be additionally added.

Another objective of the present invention is to provide a prepreg, which has characteristics of low dielectric constant and low dielectric dissipation, excellent heat resistance and flame retardance, and being free of halogen. Accordingly, the prepreg of the present invention may contain a reinforcing material and the resin composition described above, in which the resin composition is attached on the reinforcing material through impregnation, and then is semi-cured by heating at a high temperature. The reinforcing material may be a fiber material, a woven or non-woven fabric, such as glass fiber cloth, and can improve the mechanic strength of the prepreg. In addition, the reinforcing material may be optionally pre-treated by a silane coupling agent.

The prepreg may be heated at a high temperature or at a high temperature and high pressure and cured to obtain a cured film or a solid insulating layer, and if the resin composition contains a solvent, the solvent can be removed through evaporation in the high-temperature heating process.

Another objective of the present invention is to provide a laminate, which has characteristics of low dielectric property, excellent heat resistance and flame retardance, and being free of halogen, and is particularly useful in manufacturing high-speed high-frequency signal transmission circuit board. Accordingly, the present invention provides a laminate, which includes two or more metal foils and at least one insulating layer. The metal foil is, for example, a copper foil, and may further include at least one metal alloy such as aluminum, nickel, platinum, silver and gold. The insulating layer is formed by the prepreg through curing at a high temperature and high pressure, for example, by stacking the prepreg between two metal foils and laminating at a high temperature and high pressure.

The laminate of the present invention at least has one of the following advantages: low dielectric constant and low dielectric dissipation, excellent heat resistance and flame retardance, high thermal conductivity, and environmental protection of being free of halogen. The laminate may be further subjected to a process of circuiting fabrication, to form a circuit board, and after being bonded with electronic elements, the quality of the circuit board is not influenced when being operated in a severe environment such as high temperature and high humidity.

Accordingly, another objective of the present invention is to provide a printed circuit board, which has characteristics of low dielectric property, excellent heat resistance and flame retardance, and being free of halogen, and is useful in high-speed high-frequency signal transmission. The circuit board includes at least one laminate described above, and the circuit board can be fabricated by a conventional process.

In order to further disclose the present invention, so that persons of ordinary skill in the art can implement the present invention according to the disclosure of the specification, the present invention is further described below with several embodiments. However, it should be noted that, the following embodiments are merely used to further describe the present invention, but not intended to limit the implementation scope of the present invention, and any modifications and variations made by persons of ordinary skill in the art without departing from the spirit of the present invention shall fall within the scope of the present invention.

BRIEF DESCRIPTION OF THE DRAWINGS

No drawings.

PREFERRED EMBODIMENTS OF THE PRESENT INVENTION

Example A-1

Pre-Polymerization of Cyanate Ester Resin with Butadiene 100 g cyanate ester (BA-230s, available from Lonza) and 10 g polybutadiene (hydroxyl terminated polybutadiene, LBH p2000, available from Krasol), 0.5 g 4-tert-butylcatechol and 120 g toluene were added into a reactor equipped with a stirring apparatus with the temperature set at 120° C., 0.01 g cobalt acetylacetonate and 1 g DCP were added, and reacted for 6 hours, to obtain a butadiene pre-polymerized cyanate ester resin (A-1).

Example A-2

Pre-Polymerization of Cyanate Ester Resin with Butadiene 100 g cyanate ester (BA-230s, available from Lonza) and 20 g polybutadiene (hydroxyl terminated polybutadiene, LBH p2000, available from Krasol), 0.5 g 4-tert-butylcatechol and 120 g toluene were added into a reactor equipped with a stirring apparatus with the temperature set at 120° C., 0.01 g cobalt acetylacetonate and 1 g DCP were added, and reacted for 6 hours, to obtain a butadiene pre-polymerized cyanate ester resin (A-2).

Example A-3

Pre-Polymerization of Cyanate Ester Resin with Butadiene 100 g cyanate ester (BA-230s, available from Lonza) and 30 g polybutadiene (hydroxyl terminated polybutadiene, LBH p2000, available from Krasol), 0.5 g 4-tert-butylcatechol and 120 g toluene were added into a reactor equipped with a stirring apparatus with the temperature set at 120° C., 0.01 g cobalt acetylacetonate and 1 g DCP were added, and reacted for 6 hours, to obtain a butadiene pre-polymerized cyanate ester resin (A-3).

Components of resin compositions of Examples 1 to 10 and Comparative Examples 1 to 7 mentioned below are respectively listed in Tables 1 and 2.

Example 1

E1

A resin composition, containing the following components:
(A) 100 parts by weight of the resin (A-1)
(B) 5 parts by weight of the styrene-maleic anhydride copolymer (EF-80)
(C) 15 parts by weight of the SBDVB terpolymer (SBDVB resin, Ricon® 257)
(D) 5 parts by weight of the acrylate resin (Sr833s, available from Sartomer)
(E) 55 parts by weight of the phosphazene compound (SPB-100)

(F) 125 parts by weight of the fused silica (filler)
(G) 170 parts by weight of the toluene (solvent)
(H) 3.5 parts by weight of the BIPB (catalyst)

Example 2

E2

A resin composition, containing the following components:
(A) 100 parts by weight of the resin (A-2)
(B) 5 parts by weight of the styrene-maleic anhydride copolymer (EF-80)
(C) 15 parts by weight of the SBDVB terpolymer (SBDVB resin, Ricon® 257)
(D) 5 parts by weight of the acrylate resin (Sr833s, available from Sartomer)
(E) 55 parts by weight of the phosphazene compound (SPB-100)
(F) 125 parts by weight of the fused silica (filler)
(G) 170 parts by weight of the toluene (solvent)
(H) 3.5 parts by weight of the BIPB (catalyst)

Example 3

E3

A resin composition, containing the following components:
(A) 100 parts by weight of the resin (A-3)
(B) 5 parts by weight of the styrene-maleic anhydride copolymer (EF-80)
(C) 15 parts by weight of the SBDVB terpolymer (SBDV resin, Ricon® 257)
(D) 5 parts by weight of the acrylate resin (Sr833s, available from Sartomer)
(E) 55 parts by weight of the phosphazene compound (SPB-100)
(F) 125 parts by weight of the fused silica (filler)
(G) 170 parts by weight of the toluene (solvent)
(H) 3.5 parts by weight of the BIPB (catalyst)

Example 4

E4

A resin composition, containing the following components:
(A) 100 parts by weight of the cyanate ester resin (BA-230s, available from Lonza)
(B) 5 parts by weight of the styrene-maleic anhydride copolymer (EF-80)
(C) 15 parts by weight of the SBDVB terpolymer (SBDV resin, Ricon® 257)
(D) 5 parts by weight of the acrylate resin (Sr833s, available from Sartomer)
(E) 55 parts by weight of the phosphazene compound (SPB-100)
(F) 125 parts by weight of the fused silica (filler)
(G) 170 parts by weight of the toluene (solvent)
(H) 3.5 parts by weight of the BIPB (catalyst)

Example 5

E5

A resin composition, containing the following components:
(A) 100 parts by weight of the cyanate ester resin (A-3)
(B) 80 parts by weight of the styrene-maleic anhydride copolymer (EF-80)
(C) 15 parts by weight of the SBDVB terpolymer (SBDV resin, Ricon® 257)
(D) 5 parts by weight of the acrylate resin (Sr833s, available from Sartomer)
(E) 55 parts by weight of the phosphazene compound (FP-110)
(F) 125 parts by weight of the fused silica (filler)
(G) 170 parts by weight of the toluene (solvent)
(H) 3.5 parts by weight of the BIPB (catalyst)

Example 6

E6

A resin composition, containing the following components:
(A) 100 parts by weight of the cyanate ester resin (A-3)
(B) 5 parts by weight of the styrene-maleic anhydride copolymer (EF-80)
(C) 80 parts by weight of the SBDVB terpolymer (SBDV resin, Ricon®257)
(D) 5 parts by weight of the acrylate resin (Sr833s, available from Sartomer)
(E) 55 parts by weight of the aluminum diethylphosphinate (OP-935)
(F) 125 parts by weight of the fused silica (filler)
(G) 170 parts by weight of the toluene (solvent)
(H) 3.5 parts by weight of the BIPB (catalyst)

Example 7

E7

A resin composition, containing the following components:
(A) 100 parts by weight of the cyanate ester resin (A-3)
(B) 5 parts by weight of the styrene-maleic anhydride copolymer (EF-80)
(C) 15 parts by weight of the SBDVB terpolymer (SBDV resin, Ricon®257)
(D) 60 parts by weight of the acrylate resin (Sr833s, available from Sartomer)
(E) 55 parts by weight of the melamine polyphosphate (Melapur 200)
(F) 125 parts by weight of the fused silica (filler)
(G) 170 parts by weight of the toluene (solvent)
(H) 3.5 parts by weight of the BIPB (catalyst)

Example 8

E8

A resin composition, containing the following components:
(A) 100 parts by weight of the cyanate ester resin (A-3)
(B) 5 parts by weight of the styrene-maleic anhydride copolymer (EF-80)
(C) 15 parts by weight of the SBDVB terpolymer (SBDV resin, Ricon®257)
(D) 5 parts by weight of the polybutadiene diacrylate oligomer (for example, CN307, a product available from Sartomer)
(E) 55 parts by weight of the melamine polyphosphate (Melapur 200)

(F) 125 parts by weight of the fused silica (filler)
(G) 170 parts by weight of the toluene (solvent)
(H) 3.5 parts by weight of the BIPB (catalyst)

Example 9

E9

A resin composition, containing the following components:
(A) 100 parts by weight of the cyanate ester resin (A-3)
(B) 30 parts by weight of the styrene-maleic anhydride copolymer (EF-80)
(C) 45 parts by weight of the SBDVB terpolymer (SBDV resin, Ricon® 257)
(D) 35 parts by weight of the acrylate resin (Sr833s, available from Sartomer)
(E) 55 parts by weight of the phosphazene compound (SPB-100)
(F) 125 parts by weight of the fused silica (filler)
(G) 170 parts by weight of the toluene (solvent)
(H) 3.5 parts by weight of the BIPB (catalyst)

Example 10

E10

A resin composition, containing the following components:
(A) 100 parts by weight of the cyanate ester resin (A-3)
(B) 30 parts by weight of the styrene-maleic anhydride copolymer (EF-80)
(C) 20 parts by weight of the polyphenylene oxide (OPE-2st)
(D) 45 parts by weight of the SBDVB terpolymer (SBDV resin, Ricon®257)
(E) 35 parts by weight of the acrylate resin (Sr833s, available from Sartomer)
(F) 55 parts by weight of the phosphazene compound (SPB-100)
(G) 125 parts by weight of the fused silica (filler)
(H) 170 parts by weight of the toluene (solvent)
(I) 3.5 parts by weight of the BIPB (catalyst)

Comparative Example 1

C1

A resin composition, containing the following components:
(A) 100 parts by weight of the cyanate ester resin (BA-230s, available from Lonza)
(B) 15 parts by weight of the SBDVB terpolymer (SBDV resin, Ricon® 257)
(C) 5 parts by weight of the acrylate resin (Sr833s, available from Sartomer)
(D) 55 parts by weight of the phosphazene compound (SPB-100)
(E) 125 parts by weight of the fused silica (filler)
(F) 170 parts by weight of the toluene (solvent)
(G) 3.5 parts by weight of the BIPB (catalyst)

Comparative Example 2

C2

A resin composition, containing the following components:
(A) 100 parts by weight of the cyanate ester resin (BA-230s, available from Lonza)
(B) 85 parts by weight of the styrene-maleic anhydride copolymer (EF-80)
(C) 15 parts by weight of the SBDVB terpolymer (SBDV resin, Ricon® 257)
(D) 5 parts by weight of the acrylate resin (Sr833s, available from Sartomer)
(E) 55 parts by weight of the phosphazene compound (SPB-100)
(F) 125 parts by weight of the fused silica (filler)
(G) 170 parts by weight of the toluene (solvent)
(H) 3.5 parts by weight of the BIPB (catalyst)

Comparative Example 3

C3

A resin composition, containing the following components:
(A) 100 parts by weight of the cyanate ester resin (BA-230s, available from Lonza)
(B) 5 parts by weight of the styrene-maleic anhydride copolymer (EF-80)
(C) 5 parts by weight of the acrylate resin (Sr833s, available from Sartomer)
(D) 55 parts by weight of the phosphazene compound (SPB-100)
(E) 125 parts by weight of the fused silica (filler)
(F) 170 parts by weight of the toluene (solvent)
(G) 3.5 parts by weight of the BIPB (catalyst)

Comparative Example 4

C4

A resin composition, containing the following components:
(A) 100 parts by weight of the cyanate ester resin (BA-230s, available from Lonza)
(B) 5 parts by weight of the styrene-maleic anhydride copolymer (EF-80)
(C) 85 parts by weight of the SBDVB terpolymer (SBDV resin, Ricon® 257)
(D) 5 parts by weight of the acrylate resin (Sr833s, available from Sartomer)
(E) 55 parts by weight of the phosphazene compound (SPB-100)
(F) 125 parts by weight of the fused silica (filler)
(G) 170 parts by weight of the toluene (solvent)
(H) 3.5 parts by weight of the BIPB (catalyst)

Comparative Example 5

C5

A resin composition, containing the following components:
(A) 100 parts by weight of the cyanate ester resin (BA-230s, available from Lonza)
(B) 5 parts by weight of the styrene-maleic anhydride copolymer (EF-80)
(C) 15 parts by weight of the SBDVB terpolymer (SBDV resin, Ricon® 257)
(D) 55 parts by weight of the phosphazene compound (SPB-100)
(E) 125 parts by weight of the fused silica (filler)

(F) 170 parts by weight of the toluene (solvent)
(G) 3.5 parts by weight of the BIPB (catalyst)

Comparative Example 6

C6

A resin composition, containing the following components:
(A) 100 parts by weight of the cyanate ester resin (BA-230s, available from Lonza)
(B) 5 parts by weight of the styrene-maleic anhydride copolymer (EF-80)
(C) 15 parts by weight of the SBDVB terpolymer (SBDV resin, Ricon® 257)
(D) 65 parts by weight of the acrylate resin (Sr833s, available from Sartomer)
(E) 55 parts by weight of the phosphazene compound (SPB-100)
(F) 125 parts by weight of the fused silica (filler)
(G) 170 parts by weight of the toluene (solvent)
(H) 3.5 parts by weight of the BIPB (catalyst)

Comparative Example 7

C7

A resin composition, containing the following components:
(A) 100 parts by weight of the cyanate ester resin (BA-230s, available from Lonza)
(B) 5 parts by weight of the styrene-maleic anhydride copolymer (EF-80)
(C) 15 parts by weight of the SBDVB terpolymer (SBDV resin, Ricon® 257)
(D) 5 parts by weight of the acrylate resin (Sr833s, available from Sartomer)
(E) 20 parts by weight of the phosphazene compound (SPB-100)
(F) 125 parts by weight of the fused silica (filler)
(G) 170 parts by weight of the toluene (solvent)
(H) 3.5 parts by weight of the BIPB (catalyst)

TABLE 1

| Component | | E1 | E2 | E3 | E4 | E5 | E6 | E7 | E8 | E9 | E10 |
|---|---|---|---|---|---|---|---|---|---|---|---|
| Cyanate ester resin | A-1 | 100 | | | | | | | | | |
| | A-2 | | 100 | | | | | | | | |
| | A-3 | | | 100 | | 100 | 100 | 100 | 100 | 100 | 100 |
| | BA-230S | | | | 100 | | | | | | |
| Styrene-maleic anhydride copolymer | EF-80 | 5 | 5 | 5 | 5 | 80 | 5 | 5 | 5 | 30 | 30 |
| Polyphenylene oxide | OPE-2st | | | | | | | | | | 20 |
| Styrene-butadiene-divinyl benzene | SBDVB, Ricon ®257 | 15 | 15 | 15 | 15 | 15 | 80 | 15 | 15 | 45 | 45 |
| Acrylate | Sr833s | 5 | 5 | 5 | 5 | 5 | 5 | 60 | | 35 | 35 |
| | CN307 | | | | | | | | 5 | | |
| Flame retardant | SPB-100 | 55 | 55 | 55 | 55 | | | | | 55 | 55 |
| | FP-110 | | | | | 55 | | | | | |
| | OP-935 | | | | | | 55 | | | | |
| | Melapur200 | | | | | | | 55 | 55 | | |
| Filler (silica) | fused silica | 125 | 125 | 125 | 125 | 125 | 125 | 125 | 125 | 125 | 125 |
| Solvent | toluene | 170 | 170 | 170 | 170 | 170 | 170 | 170 | 170 | 170 | 170 |
| Catalyst | BIPB | 3.5 | 3.5 | 3.5 | 3.5 | 3.5 | 3.5 | 3.5 | 3.5 | 3.5 | 3.5 |

Unit: parts by weight

TABLE 2

| Component | | C1 | C2 | C3 | C4 | C5 | C6 | C7 |
|---|---|---|---|---|---|---|---|---|
| Cyanate ester resin | BA-230S | 100 | 100 | 100 | 100 | 100 | 100 | 100 |
| Styrene-maleic anhydride copolymer | EF-80 | 0 | 85 | 5 | 5 | 5 | 5 | 5 |
| Styrene-butadiene-divinyl benzene | SBDVB, Ricon ®257 | 15 | 15 | 0 | 85 | 15 | 15 | 15 |
| Acrylate | Sr833s | 5 | 5 | 5 | 5 | 0 | 65 | 5 |
| Flame retardant | SPB-100 | 55 | 55 | 55 | 55 | 55 | 55 | 20 |
| Filler (silica) | fused silica | 125 | 125 | 125 | 125 | 125 | 125 | 125 |
| Solvent | toluene | 170 | 170 | 170 | 170 | 170 | 170 | 170 |
| Catalyst | BIPB | 3.5 | 3.5 | 3.5 | 3.5 | 3.5 | 3.5 | 3.5 |

The resin compositions of Examples 1 to 10 and Comparative Examples 1 to 7 are mixed uniformly in a stirring tank in batches, and fed into an impregnation tank, and then a glass fiber cloth passes through the impregnation tank, so that the resin composition is attached on the glass fiber cloth, and then semi-cured by heating to obtain a prepreg.

(the lower the Df is, the better the dielectric property is, and if a difference is up to 0.001, it indicates the difference is significant), flame resistance (flaming test, UL94, the level sequence is V-0>V-1>V-2). The measurement results of the laminates fabricated with the resin compositions of Examples 1 to 10 and Comparative Examples 1 to 7 are respectively listed in Tables 3 and 4,

TABLE 3

| Property test | Test method | E1 | E2 | E3 | E4 | E5 | E6 | E7 | E8 | E9 | E10 |
|---|---|---|---|---|---|---|---|---|---|---|---|
| Tg | DMA | 204 | 198 | 196 | 208 | 211 | 185 | 189 | 193 | 201 | 199 |
| T288 | T-288 (min) | >60 | >60 | >60 | >60 | 30 | 30 | >60 | >60 | >60 | >60 |
| P/S | peel (Hoz) (lb/in) | 5.34 | 5.23 | 5.13 | 5.61 | 4.3 | 4.04 | 5.81 | 5.34 | 5.53 | 5.13 |
| Td | TGA | 394 | 386 | 377 | 393 | 385 | 356 | 377 | 371 | 390 | 382 |
| S/D | round | >20 | >20 | >20 | >20 | 15 | 13 | 14 | >20 | >20 | >20 |
| PCT (3 hr) | PCT dip 288° C., 20 s | >5 hr | >5 hr | >5 hr | >5 hr | delamination @3 hr | delamination @3 hr | delamination @2 hr | >5 hr | >5 hr | >5 hr |
| Dk | Dk (10 GHz) | 3.87 | 3.82 | 3.74 | 3.88 | 3.76 | 3.65 | 4.01 | 3.71 | 3.75 | 3.87 |
| Df | Df (10 GHz) | 0.0063 | 0.0061 | 0.0058 | 0.0081 | 0.0062 | 0.0053 | 0.0091 | 0.0056 | 0.0057 | 0.0065 |
| Flame resistance test | UL94 | V-0 | V-0 | V-0 | V-0 | V-0 | V-0 | V-0 | V-0 | V-0 | V-0 |

TABLE 4

| Property test | Test method | C1 | C2 | C3 | C4 | C5 | C6 | C7 |
|---|---|---|---|---|---|---|---|---|
| Tg | DMA | 208 | 190 | 211 | 186 | 194 | 190 | 209 |
| T288 | T-288 (min) | >60 | 30 | >60 | 30 | 30 | 50 | >60 |
| P/S | peel (Hoz) (lb/in) | 5.64 | 4.34 | 5.53 | 4.12 | 5.1 | 5.83 | 5.77 |
| Td | TGA | 388 | 386 | 377 | 349 | 383 | 376 | 387 |
| S/D | round | >20 | 12 | >20 | 15 | >20 | 13 | >20 |
| PCT (3 hr) | PCT dip 288° C., 20 s | >5 hr | delamination @2 hr | >5 hr | delamination @2 hr | >5 hr | delamination @3 hr | >5 hr |
| Dk | Dk (10 GHz) | 3.89 | 3.82 | 3.94 | 3.79 | 3.86 | 4.05 | 3.85 |
| Df | Df (10 GHz) | 0.0083 | 0.0079 | 0.0088 | 0.0072 | 0.0082 | 0.0103 | 0.0081 |
| Flame resistance test | UL94 | V-0 | V-0 | V-0 | V-0 | V-0 | V-0 | V-1 |

For the prepreg obtained in batches, four pieces of prepreg of the same batch and two pieces of 18-μm copper foil are taken and stacked in the order of one piece of copper foil, four pieces of prepreg and one piece of copper foil, and then laminated for 2 hours at 220° C. in vacuum, to form a laminate, in which the four pieces of prepreg are cured to form an insulating layer between the two pieces of copper foil.

The copper foil-containing laminates and copper foils are etched, and the resulting copper-free laminates are measured for physical property, and the physical property items include glass transition temperature (Tg), heat resistance of copper-containing substrate (T288 and Td), copper-containing laminate solder dip test (solder dip, 288° C., 10 second, testing the heat resistance round, S/D), copper-free laminate PCT post-moisture sorption solder dip test (pressure cooking at 121° C. for 1 hour, testing solder dip at 288° C. for 20, and observing whether delamination occurs, PCT), peel strength between copper foil and substrate (peel strength, half ounce copper foil, P/S), dielectric constant (the lower the Dk is, the better the dielectric property is, and if a difference is up to 0.1, it indicates the difference is significant), dielectric dissipation It can be found from data of Examples 1 to 10 in Table 3 that, the resin composition of the present invention has the following excellent properties: high Tg, good thermal stability, high peel strength, low dielectric constant, low dielectric dissipation and good flame resistance. The addition proportion of the components of the resin composition of Example 9 is preferred, and the property of the laminate manufactured by the resin composition of Example 9 is better according to comprehensive comparison. In addition, it indicates in Example 10 that polyphenylene oxide, preferably styrene modified polyphenylene oxide may be optionally added.

According to the present invention, it is found (for example, through comparison of Example 4 with Examples 1 to 3), butadiene pre-polymerized cyanate ester resin can improve the dielectric dissipation (lower) and dielectric constant (lower) of the base material; and the higher the content of butadiene in the butadiene pre-polymerized cyanate ester resin is, the better the dielectric dissipation property is (for example, through comparison of Examples 1 to 3).

According to the present invention, it is found (for example, through comparison of Example 4 with Comparative Example 1), addition of styrene-maleic anhydride copolymer can improve the thermal stability of the base material; however, if the content of the styrene-maleic anhydride copolymer is greater than 80 parts by weight, adverse effects occur on the Tg, thermal stability, dielectric constant and the dielectric dissipation of the base material (for example, through comparison of Example 4 with Comparative Example 2).

According to the present invention, it is found (for example, through comparison of Example 4 with Comparative Example 3), addition of styrene-butadiene-divinyl benzene can improve the dielectric constant and dielectric dissipation of the base material; however, if the content of the styrene-butadiene-divinyl benzene is greater than 80 parts by weight, adverse effects occur on the Tg and thermal stability of the base material (for example, through comparison of Example 4 with Comparative Example 4).

According to the present invention, it is found (for example, through comparison of Example 4 with Comparative Example 5), addition of the acrylate compound may improve the Tg, thermal stability and peel strength of the base material; however, if the content of the acrylate compound is greater than 60 parts by weight, adverse effects occur on the Tg, thermal stability, dielectric constant and dielectric dissipation of the base material (for example, through comparison of Example 4 with Comparative Example 6).

On the other hand, it can be known through comparison of Example 4 with Comparative Example 7 that, addition of the flame retardant can improve the of the base material, and the higher the addition of the flame retardant is, the better the test results of flame resistance are.

Due to the specific formulation, the resin composition of the present invention exhibits low dielectric constant, low dielectric dissipation, high thermal stability and high flame resistance, and is useful in manufacturing a prepreg or a resin film, and is further useful in manufacturing a laminate and a printed circuit board.

Although the present invention is disclosed as above with preferable examples, persons skilled in the art should understand that the Examples are merely used to describe the present invention, but not intended to limit the scope of the present invention. It should be noted that, any equivalent variations and replacements of the Examples fall within the scope of the present invention. Therefore, the protection scope of the present invention depends on those defined by the scope of the following claims.

What is claimed is:

1. A resin composition, comprising:
   100 parts by weight of the cyanate ester resin;
   5 to 80 parts by weight of the styrene-maleic anhydride copolymer;
   15 to 80 parts by weight of the styrene-butadiene-divinyl benzene (SBDVB) terpolymer; and
   5 to 60 parts by weight of an acrylate compound, wherein the contents of the styrene-maleic anhydride copolymer, the SBDVB terpolymer and the acrylate compound are based on 100 parts by weight of the cyanate ester resin, and wherein the acrylate compound is a tricyclodecane dimethanol diacrylate.

2. The resin composition according to claim 1, wherein the cyanate ester resin is pre-polymerized with butadiene.

3. The resin composition according to claim 1, wherein the cyanate ester resin comprises a structure selected from the group consisting of:

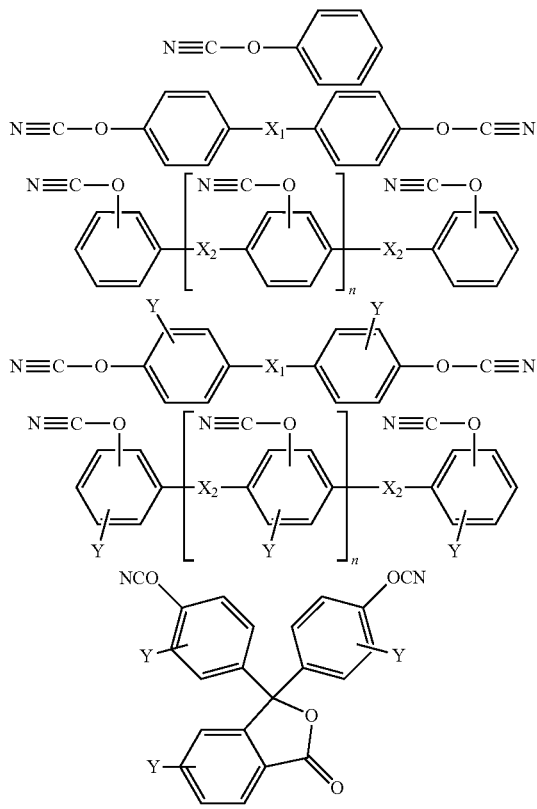

wherein $X_1$ and $X_2$ are each independently at least one R, Ar', $SO_2$ or O; R is selected from —$C(CH_3)_2$—, —CH($CH_3$)—, —$CH_2$— and a group containing dicyclopentadienyl (DCPD); Ar' is selected from benzene, biphenyl, naphthalene, phenol novolac, bisphenol A, cyclofluorene, hydrogenated bisphenol A, bisphenol A novolac, bisphenol F and bisphenol F novolac functional groups; n is an integer greater than or equal to 1; and Y is an aliphatic functional group or an aromatic functional group.

4. The resin composition according to claim 1, further comprising a halogen-free flame retardant.

5. The resin composition according to claim 4, wherein the halogen-free flame retardant is selected from the group consisting of phosphazene, aluminum diethylphosphinate, melamine polyphosphate, and combinations thereof.

6. The resin composition according to claim 1, further comprising at least one additive selected from the group consisting of an inorganic filler, a catalyst, a silane coupling agent, a toughening agent, and a solvent.

7. The resin composition according to claim 6, wherein the inorganic filler is fused silica, and the catalyst is di(tert-butylperoxyisopropyl)benzene (BIPB).

8. The resin composition according to claim 1, further comprising polyphenylene oxide.

9. A prepreg, comprising the resin composition according to claim 1.

10. A laminate, comprising the prepreg according to claim 9.

11. A printed circuit board, comprising the laminate according to claim 10.

* * * * *